United States Patent [19]
Sobel

[11] Patent Number: 5,557,233
[45] Date of Patent: Sep. 17, 1996

[54] FILTER FOR COMPUTER BUS SIGNALS

[75] Inventor: Arthur Sobel, Los Altos Hills, Calif.

[73] Assignee: VLSI Technology, Inc., San Jose, Calif.

[21] Appl. No.: 316,280

[22] Filed: Sep. 30, 1994

[51] Int. Cl.$^6$ .............................. H04B 1/10; H03K 5/153
[52] U.S. Cl. ................ 327/552; 327/58; 327/60
[58] Field of Search ................... 327/552, 58, 60

[56] References Cited

PUBLICATIONS

IBM Tech. Disc. Bul. "Maximum–voltage Sensor and Storage" Grimes vol. 19 No. 5 Oct. 1976 pp. 1552–1553.

*Primary Examiner*—Margaret Rose Wambach
*Attorney, Agent, or Firm*—Flehr, Hohbach, Test Albritton & Herbert

[57] ABSTRACT

A circuit is described for processing an input signal received from a bus of a computer. The circuit includes level identification circuitry to characterize the magnitude of the input signal and to generate a corresponding level identification signal. Level toggle circuitry is connected to the level identification circuitry to process the level identification signal and generate a level hold signal during spurious signal transitions in the input signal. The level toggle circuitry generates a level toggle signal at a predetermined point of the input signal after the spurious signal transitions have subsided. Level hold circuitry, connected to the level identification circuitry and the level toggle circuitry, processes the level identification signal, the level hold signal, and the level toggle signal. During spurious signal transitions in the input signal, the level hold circuitry maintains a high digital circuit output value in response to the level hold signal and the level identification signal. After the input signal has reached its peak value, a low digital circuit output signal is produced by the level hold circuitry in response to the level identification signal and the level toggle signal.

14 Claims, 5 Drawing Sheets

FILTER FOR COMPUTER BUS SIGNALS

BRIEF DESCRIPTION OF THE INVENTION

This invention relates generally to communication buses in computers. More particularly, this invention relates to a filter for eliminating the spurious signal transitions associated with signals received from a computer bus.

BACKGROUND OF THE INVENTION

A bus is a set of conductors that serve as a common data transmission path for a set of computer components. For example, a bus may serve as a common data transmission path for a central processing unit (CPU), a hard disc drive storage device, and an external connector that is used for attachment to some type of peripheral device, such as a printer.

If a bus were a perfect transmission line, then high signals (digital ONES) written to the bus would experience a uniform rise. However, the computer components connected to the bus create distorted high signals. Specifically, the computer components connected to the bus constitute lumped capacitive loads and stubs that can produce a digital ONE signal with several spurious signal transitions before a final peak value is reached. FIG. 1 illustrates a digital ONE signal that is commonly produced on a computer bus. The signal includes an initial rising component 10, an intermediate falling component 12, a flat component 14, a final rising component 16, a final high or peak value 18 (digital ONE), and a signal completion falling component 19. The intermediate falling component 12 and flat component 14 can be characterized as spurious signal transitions. As used herein, the term spurious signal transition refers to any signal transition that erroneously represents a change in signal value. A computer component connected to the bus interprets a spurious signal transition as a change in signal value. Consequently, the computer component processes erroneous data signals.

The problem of spurious signal transitions has been addressed by processing a signal from a bus with a low pass filter and a Schmitt trigger. Unfortunately, this type of circuit cannot distinguish between the initial rising component of the waveform and the final high value of the waveform when there is an intermediate falling component in the waveform.

Thus, it would be highly desirable to provide a filter for signals received from a computer bus. In particular, it would be highly desirable to provide a circuit that does not erroneously respond to spurious transitions in a signal received from a computer bus.

SUMMARY OF THE INVENTION

The invention is a circuit for processing an input signal received from a bus of a computer. The circuit includes level identification circuitry to characterize the magnitude of the input signal and to generate a corresponding level identification signal. Level toggle circuitry is connected to the level identification circuitry to process the level identification signal and generate a level hold signal during spurious signal transitions in the input signal. The level toggle circuitry generates a level toggle signal at a predetermined point of the input signal after the spurious signal transitions have subsided. Level hold circuitry, connected to the level identification circuitry and the level toggle circuitry, processes the level identification signal, the level hold signal, and the level toggle signal. During spurious signal transitions in the input signal, the level hold circuitry maintains a high digital circuit output value in response to the level hold signal and the level identification signal. After the input signal has reached its peak value, a low digital circuit output signal is produced by the level hold circuitry in response to the level identification signal and the level toggle signal.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 2:
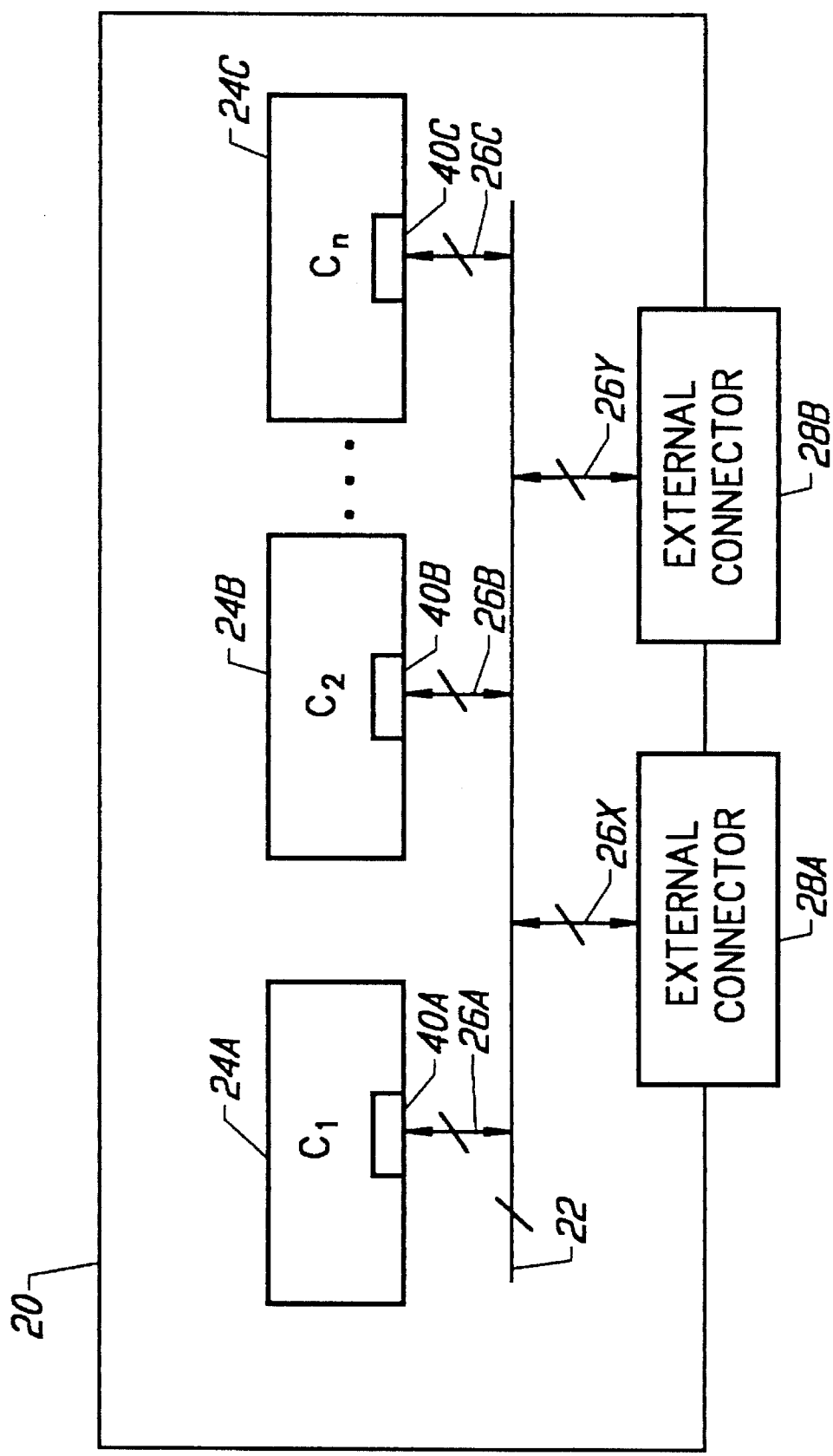
FIG. 2 is a schematic illustrating a general purpose computer including a system bus, a number of computer components connected to the system bus, and the circuit of the invention incorporated into each of the computer components.

FIG. 2 is a simplified schematic of a general purpose computer 20 that includes a system bus 22. Connected to the system bus 22 are a number of computer components C1, C2, ..., and Cn (respective designated 24A, 24B, ..., and 24n, and generally designated 24). By way of example, the computer components may be a Central Processing Unit, Random Access Memory, and a disc drive. Each computer component 24 is connected to the system bus 22 with a bus connector 26. The system bus 22 is also connected to one or more external connectors 28A, 28B. The external connectors 28 allow the system bus to communicate with a peripheral device such as a printer or a mass storage device. The external connectors 28A and 28B are connected to the system bus via bus connectors 26X and 26Y.

Each computer component 24 of the computer 20 includes a processing circuit 40 in accordance with the invention. The processing circuit 40 of the invention processes one signal. Thus, one processing circuit 40 is required for each conductor associated with a bus 22. Alternately, the processing circuit 40 may only be applied to selected critical lines of the bus 22. For example, the circuit 40 may only be used by the interrupt, read/write request, and acknowledge lines. These lines carry signals that should be rapidly processed. In contrast, the data lines of the bus need not include the circuit 40 of the invention since the processing time is less critical.

Figure 3:
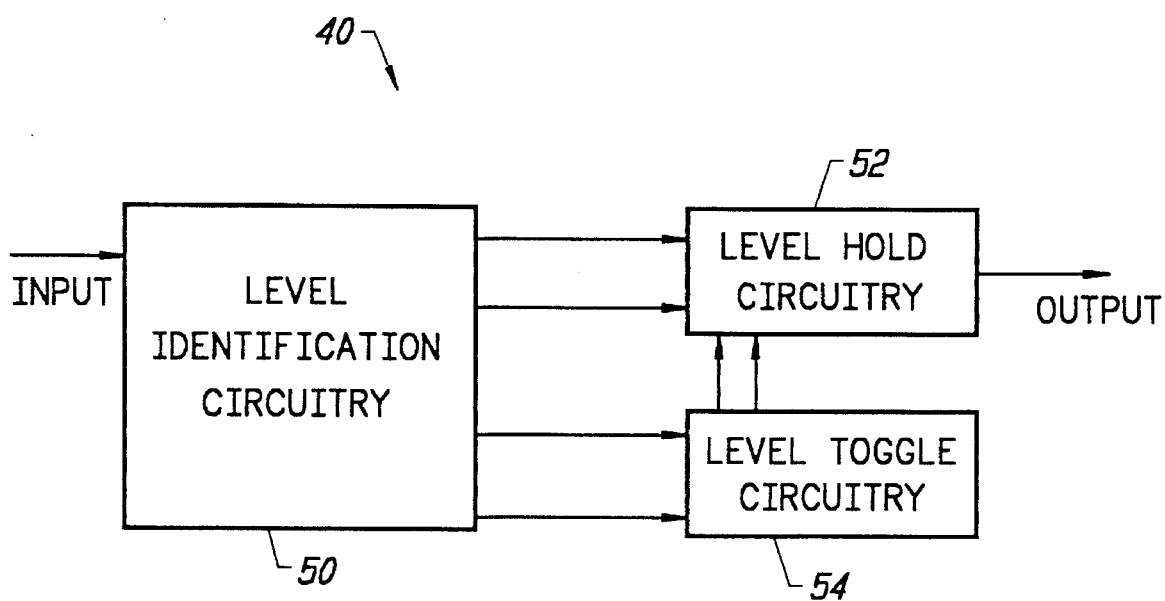
FIG. 3 is a generalized schematic of the circuit of the invention.

The processing circuit 40 of the invention, also referred to herein as a filter, is generally depicted in FIG. 3. The processing circuit 40 includes level identification circuitry 50 that processes an input signal. The level identification circuitry generates a level identification signal characterizing the magnitude of the input signal. As will be described below, the level identification signal includes a combination of digital high and digital low signals.

The level identification signal is simultaneously processed by the level hold circuitry 52 and the level toggle circuitry 54. The level toggle circuitry 54 generates a level hold signal during spurious signal transitions in the input signal from the computer bus. The level hold signal is passed to the level hold circuitry 52. The level hold circuitry 52 processes the level identification signal and the level hold signal and produces a high digital output value during spurious signal transitions. Consequently, the computer component 24 that is using the processing circuit 40 does not erroneously read a signal transition when one does not exist.

The level toggle circuitry 54 also generates a level toggle signal after a predetermined threshold is reached. The predetermined threshold should be established at a signal magnitude level generally corresponding to the magnitude of the peak signal value. Therefore, the level toggle signal will not be activated until after spurious signal transitions have subsided. The level toggle signal is passed to the level hold circuitry 52. The level hold circuitry processes the level identification signal and the level toggle signal and produces a low digital output value when the level identification signal, which corresponds to the input signal, passes a second predetermined threshold. The second predetermined threshold should be set at some value after the peak signal value; that is, some value associated with the signal completion falling component 19 of FIG. 1.

Figure 4:
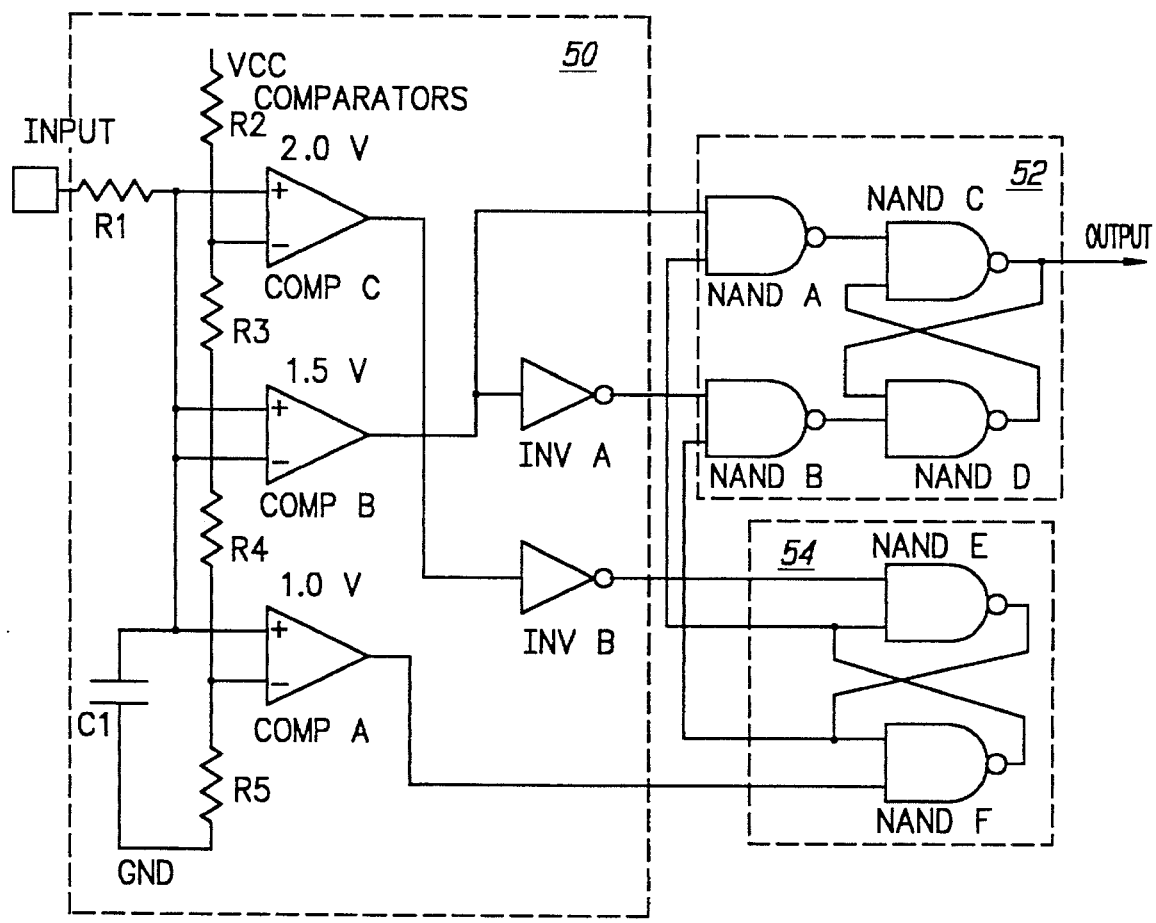
FIG. 4 is a detailed schematic of one implementation of the circuit of the invention.

The circuit of FIG. 3 is implemented in the preferred embodiment using the circuit of FIG. 4. The level identification circuitry 50 includes an input node or pad 56. A set of comparators, COMP A, COMP B, and COMP C each include one input node that is connected to the input node 56. The other input node of each comparator is connected to a predetermined voltage value. The predetermined voltage value may be obtained by using a resistor ladder 58 connected to a voltage supply Vcc. Through predetermined voltage drops across resistors R2, R3, and R4, the resistor ladder 58 may be used to provide a predetermined voltage value at each comparator. In this embodiment of the invention, comparator voltage values of 1.0 V, 1.5 V, and 2.0 V are selected.

The level identification circuitry 50 includes inverters INV A and INV B to invert some of the comparator outputs. Specifically, the output of COMP C is conveyed to INV B, while the output of COMP B is conveyed to INV A.

Note that the output of the level identification circuitry 50 is a level identification signal corresponding to the input signal. The level identification signal includes, in this embodiment, four digital signals: the outputs of COMP A, COMP B, INV A, and INV B.

FIG. 4 also illustrates a preferred implementation for the level toggle circuitry 54 of the invention. In this implementation, the level toggle circuitry 54 includes two NAND gates NAND E and NAND F. One input to NAND E is the output of INV B and the other input is the output of NAND F. One input to NAND F is the output of COMP A and the other input is the output of NAND E.

To illustrate the operation of the circuit 40 under various input signal conditions, Table I is provided below.

TABLE I

| Volts | Comparators | | | Inverters | | Nand Gates | | | | | |
|---|---|---|---|---|---|---|---|---|---|---|---|
| | A | B | C | A | B | A | B | C | D | E | F |
| 0 | 0 | 0 | 0 | 1 | 1 | 1 | 1 | 0 | 1 | 0 | 1 |

TABLE I-continued

| Volts | Comparators | | | Inverters | | Nand Gates | | | | | |
|---|---|---|---|---|---|---|---|---|---|---|---|
| | A | B | C | A | B | A | B | C | D | E | F |
| 1.5 | 1 | 1 | 0 | 0 | 1 | 0 | 1 | 1 | 0 | 0 | 1 |
| 1.0 | 1 | 0 | 0 | 1 | 1 | 1 | 1 | 1 | 0 | 0 | 1 |
| 1.5 | 1 | 1 | 0 | 0 | 1 | 0 | 1 | 1 | 0 | 0 | 1 |
| 2.5 | 1 | 1 | 1 | 0 | 0 | 1 | 1 | 1 | 0 | 1 | 0 |
| 1.5 | 1 | 1 | 0 | 0 | 1 | 1 | 1 | 1 | 0 | 1 | 0 |
| 1.0 | 1 | 0 | 0 | 1 | 1 | 1 | 0 | 0 | 1 | 1 | 0 |
| 0 | 0 | 0 | 0 | 1 | 1 | 1 | 1 | 0 | 1 | 0 | 1 |

Figure 1:
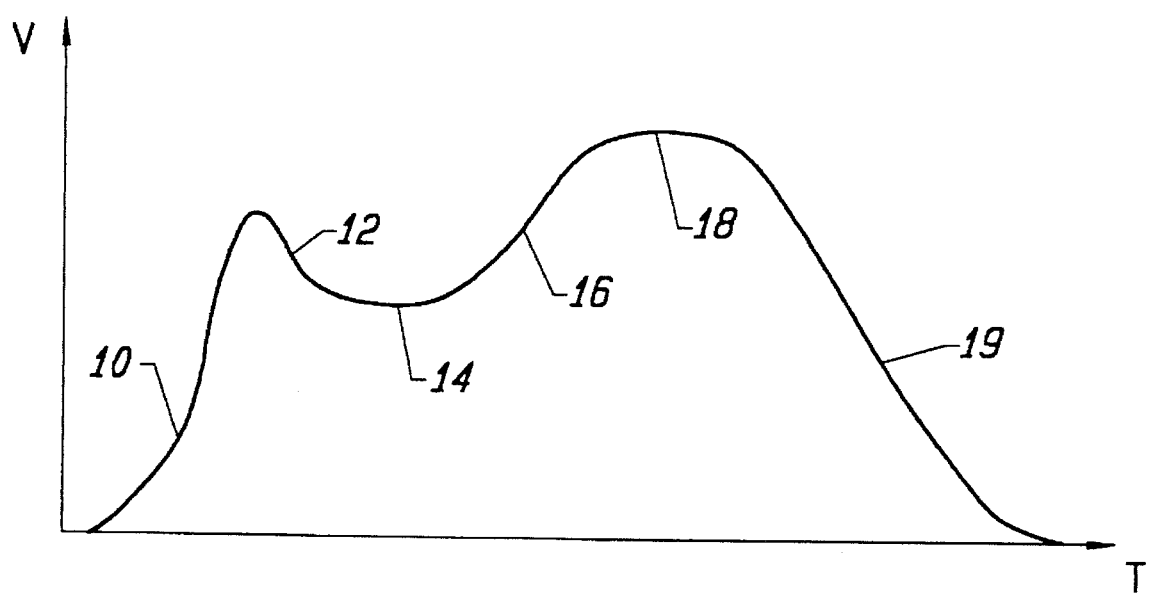
FIG. 1 is an illustration of a typical signal received from a computer bus.

Table I includes a number of input values corresponding to the waveform of FIG. 1. The 0 V and 1.5 V signals correspond to the initial rising component 10, the 1.0 V signal corresponds to the intermediate falling component 12, the 1.5 V signal corresponds to the final rising component 16, the 2.5 V signal corresponds to the peak signal 18, and the 1.5 and 1.0 V signals correspond to the signal completion falling component.

Referring now to Table I and FIG. 4, the output of NAND E is low until the input signal exceeds the threshold set by COMP C. The output of NAND F is high until the input signal exceeds the threshold set by COMP C. Thus, when the output of NAND E is high and the output of NAND F is low, a level toggle signal is generated. In other words, the level toggle signal is a high output from NAND E and a low output from NAND F. The level hold signal is the opposite signal. That is, the level hold signal constitutes a low output from NAND E and a high output from NAND F.

From another viewpoint, the NAND E and NAND F output signals can be interpreted as transition control signals as follows:

TABLE II

| E | F | Function |
|---|---|---|
| 0 | 1 | Up transition of Signal C enabled |
| 1 | 0 | Down transition of Signal C enabled |

As previously indicated, the level hold circuitry 52 processes the level hold signal and the level toggle signal. The level hold circuitry 52 is implemented in this embodiment with a set of NAND gates NAND A, NAND B, NAND C, and NAND D. One input node of NAND A is connected to the output node of COMP B and the other input node is connected to the output of NAND F. One input node of NAND B is connected to the output of INV A and the other input node is connected to the output of NAND E. One input node of NAND C is connected to the output of NAND A and the other input node is connected to the output of NAND D. One input node of NAND D is connected to the output of NAND B and the other input node is connected to the output of NAND C.

Referring now to FIG. 4 and Table I, it can be seen that the output of the circuit 40 (the output of NAND C) is held high even during spurious signal transitions (1.5 V to 1.0 V to 1.5 V in Table I). Note also that the level toggle signal is activated at 2.5 V, but the output of the circuit 40 does not go low until a second threshold is reached (below 1.5 V in this example).

Figure 5:
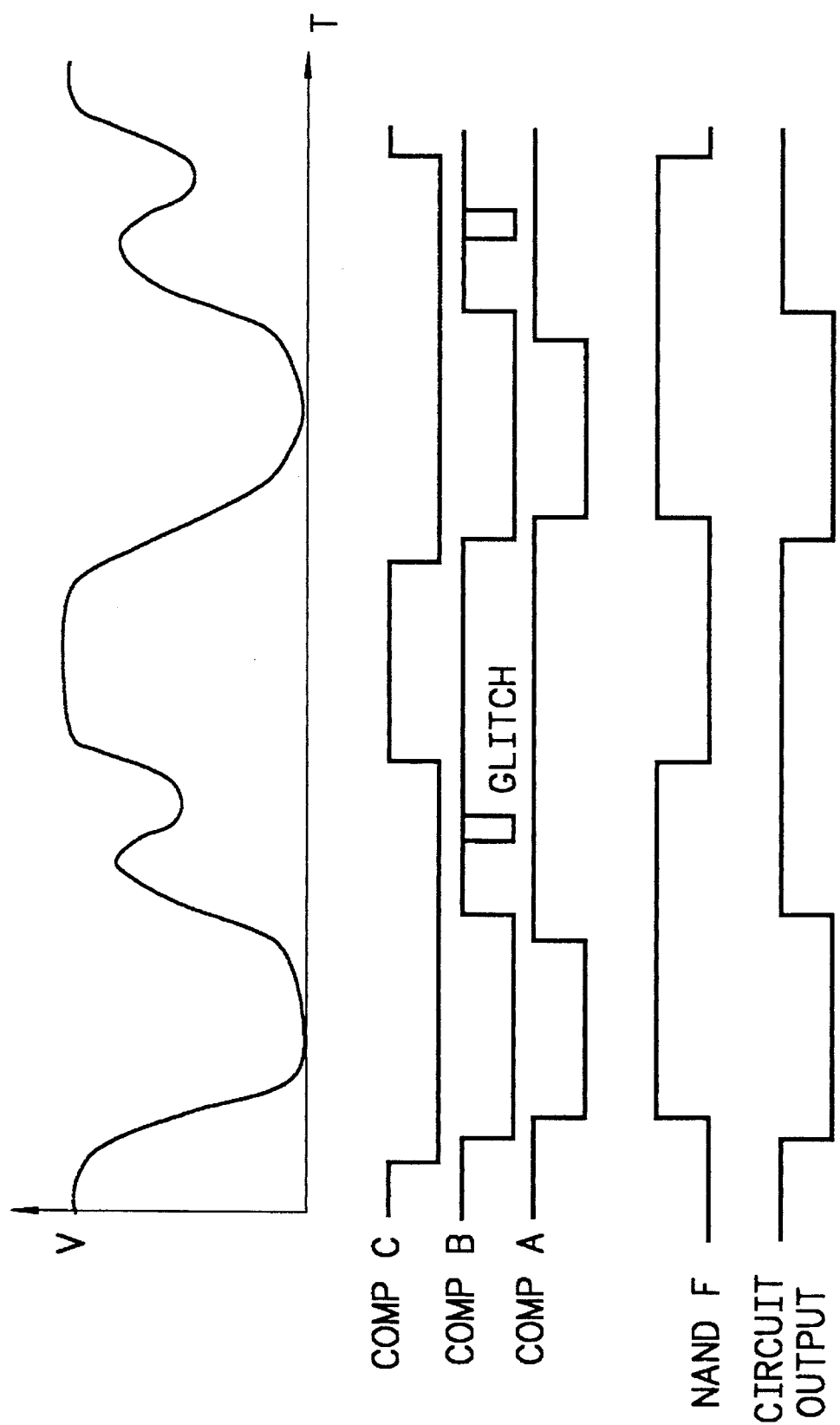
FIG. 5 illustrates a bus signal and the corresponding set of digital waveforms produced by the circuit of FIG. 4.

The operation of the invention may be more fully appreciated with reference FIG. 5. The waveform at the top of FIG. 5 is a typical bus signal. The remaining waveforms are the digital signals produced by the circuit 40 of the invention.

Note in FIG. 5 that the circuit output signal follows the output of COMP B. Also note that glitches in the COMP B signal do not drive the output signal low, as would be the case in a prior art device. More particularly, glitches in the COMP B signal before the COMP C signal is driven high, do not drive the output signal low.

As previously indicated, NAND F (and NAND E) is a level toggle signal. Note that the NAND F output is high before any of the level identification signals (COMP A, COMP B, COMP C) go high, and that the NAND F output goes low as the COMP C signal goes high. Also note that the output signal goes low while the NAND F signal is low.

From an alternate viewpoint, the operation of the invention can be described as a level sensor with output transitions enabled when the input signal rises above and falls below certain guard bands. In particular, the present invention uses at least three comparators: one comparator (COMP A) for determining when the input voltage is below a first, low guard band voltage, a second comparator (COMP C) for determining when the input voltage is above a second, high guard band voltage, and a third (COMP B) for determining when the input signal passes above or below a trip or threshold voltage between the two guard band voltages.

Thus, starting with a very low input voltage, the level toggle circuit 54 will set its internal latch to enable an up transition of the output signal at NAND C. When the input signal first rises above the trip voltage (e.g., 1.5 volts), the level hold circuit 52 switches to a High output state and outputs a High output signal at NAND C. At this point, the output signal cannot transition to a low voltage, despite any downward transitions or glitches in the input signal.

The level toggle circuit 54 does not set its internal latch to the Down transition enable state until the input signal rises above the high guard band voltage (e.g., 2.5 volts). After the level toggle circuit 54 is set in the Down transition enable state, the level hold circuit 52 will switch to a low output on signal C when the input signal falls below the trip voltage. The output signal at NAND C cannot transition from a low voltage to a high voltage, despite any upward transitions or glitches in the input signal, until the level toggle circuit 54 enables such a transition.

The level toggle circuit 54 sets its internal latch to the Up transition enable state only when the input signal falls below the low guard band voltage (e.g., 1.0 volts). After the level toggle circuit 54 is set in the Up transition enable state, the level hold circuit 52 will switch to a High output on signal C when the input signal rises above the trip voltage. When the output signal C is High, it cannot transition from a high voltage to a low voltage, despite any downward transitions or glitches in the input signal, until the level toggle circuit 54 enables such a transition.

The present invention operates in a manner distinct from that of a Schmitt trigger in that Up transitions of its output signal are enabled by the input signal falling below a low guard band voltage followed by the input signal rising above a trip voltage, whereas a Schmitt trigger circuit enables Up transitions of its output signal only when the input signal rises above a high guard band voltage that is higher than the normal trip voltage. Similarly, the present invention operates in a manner distinct from that of a Schmitt trigger in that Down transitions of its output signal are enabled by the input signal rising above a high guard band voltage followed by the input signal falling below a trip voltage, whereas a Schmitt trigger circuit enables Down transitions of its output signal only when the input signal falls below a low guard band voltage that is lower than the normal trip voltage.

Those skilled in the art will recognize the benefits associated with the present invention. Namely, the invention provides a filtering action for spurious signal transitions typically associated with signals received from a computer bus. In particular, the invention provides a circuit that maintains a high signal output during spurious signal transitions. The circuit of the invention is particularly useful in relation to signals that must be rapidly processed. In other words, signals that need to be processed before a peak signal value is reached. Examples of such signals are interrupt signals, read/write request signals, and acknowledge signals. This feature is a distinct advantage over the low pass filter and Schmitt trigger approach.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilized the invention and various embodiments with various modifications as are suited to the particular use contemplated. It is intended that the scope of the invention be defined by the following claims and their equivalents.

I claim:

1. A circuit to process an input signal received from a bus of a computer, said input signal including spurious signal transitions before a peak value is reached, said circuit comprising:

an input node to receive said input signal;

level identification circuitry connected to said input node to characterize the magnitude of said input signal and output a level identification signal, said level identification signal comprising a multiple bit digital signal; and level hold circuitry connected to said level identification circuitry to process said level identification signal to produce a high digital output signal with a first voltage level that is maintained during said spurious signal transitions and when said peak value of said input signal is reached.

2. The circuit of claim 1 further comprising:

level toggle circuitry connected to said level identification circuitry and said level hold circuitry to process said level identification signal and generate a level hold signal during said spurious signal transitions and a level toggle signal after said input signal passes a first predetermined threshold, said level hold signal and said level toggle signal being processed by said level hold circuitry.

3. The circuit of claim 1 wherein said level identification circuitry includes:

a set of comparators, each of said comparators including one comparator input node connected to said input node, a second comparator input connected to a predetermined voltage value, and a comparator output node; and a set of inverters, each of said inverters including one inverter input node connected to one of said comparator output nodes, and an inverter output node, said level identification signal including a combination of digital high and digital low signals generated at said inverter output nodes and at one or more of said comparator output nodes of said set of comparators.

4. The circuit of claim 3 wherein said level toggle circuitry includes an E NAND gate with an E NAND gate output node; and an F NAND gate with an F NAND gate output node, said E NAND gate including a first E NAND gate input node connected to one of said inverter output nodes and a second E NAND gate input node connected to said F NAND gate output node, said F NAND gate including a first F NAND gate input node connected to one of said comparator output nodes and a second F NAND gate input node connected to said E NAND gate output node.

5. The circuit of claim 4 wherein said level hold circuitry includes:

an A NAND gate with an A NAND gate output node; and a B NAND gate with a B NAND gate output node, said A NAND gate including a first A NAND gate input node connected to one of said inverter output nodes and a second A NAND gate input node connected to said F NAND gate output node, said B NAND gate including a first B NAND gate input node connected to one of said inverter output nodes and a second B NAND gate input node connected to said E NAND gate output node.

6. The circuit of claim 5 further comprising:

a C NAND gate with a C NAND gate output node; and

A D NAND gate with a D NAND gate output node, said C NAND gate including a first C NAND gate input node connected to said A NAND gate output node and a second C NAND gate input node connected to said D NAND gate output node, said D NAND gate including a first D NAND gate input node connected to said B NAND gate output node and a second D NAND gate input node connected to said C NAND gate output node.

7. A circuit for processing an input signal received from a bus of a computer, said input signal including an initial rising component, an intermediate falling component, a final rising component, and a signal completion falling component, said circuit comprising:

level identification circuitry to characterize the magnitude of said input signal and output a level identification signal;

level toggle circuitry connected to said level identification circuitry to process said level identification signal and generate a level hold signal during said intermediate falling component of said input signal and a level toggle signal after said input signal passes a first predetermined threshold; and level hold circuitry, connected to said level toggle circuitry and said level identification circuitry, to process said level identification signal, said level hold signal, and said level toggle signal, said level hold circuitry producing a high digital value in response to said level hold signal and said level identification signal during said intermediate falling component of said input signal and a low digital value in response to said level toggle signal and said level identification signal after a second predetermined threshold is reached in reference to said signal completion falling component.

8. The circuit of claim 7 wherein said level identification circuitry includes:

a set of comparators, each of said comparators including one comparator input node connected to said input node, a second comparator input connected to a predetermined voltage value, and a comparator output node; and a set of inverters, each of said inverters including one inverter input node connected to one of said comparator output nodes, and an inverter output node, said level identification signal including a combination of digital high and digital low signals generated at said inverter output nodes and at one or more of said comparator output nodes of said set of comparators.

9. The circuit of claim 8 wherein said level toggle circuitry includes an E NAND gate with an E NAND gate output node; and an F NAND gate with an F NAND gate output node, said E NAND gate including a first E NAND gate input node connected to one of said inverter output nodes and a second E NAND gate input node connected to said F NAND gate output node, said F NAND gate including a first F NAND gate input node connected to one of said comparator output nodes and a second F NAND gate input node connected to said E NAND gate output node.

10. The circuit of claim 9 wherein said level hold circuitry includes:

an A NAND gate with an A NAND gate output node; and a B NAND gate with a B NAND gate output node, said A NAND gate including a first A NAND gate input node connected to one of said inverter output nodes and a second A NAND gate input node connected to said F NAND gate output node, said B NAND gate including a first B NAND gate input node connected to one of said inverter output nodes and a second B NAND gate input node connected to said E NAND gate output node.

11. The circuit of claim 10 further comprising:

a C NAND gate with a C NAND gate output node; and

A D NAND gate with a D NAND gate output node, said C NAND gate including a first C NAND gate input node connected to said A NAND gate output node and a second C NAND gate input node connected to said D NAND gate output node, said D NAND gate including a first D NAND gate input node connected to said B NAND gate output node and a second D NAND gate input node connected to said C NAND gate output node.

12. A circuit to process an input signal received from a bus of a computer, said input signal including spurious signal transitions before a peak value is reached, said circuit comprising:

an input node to receive said input signal;

level identification circuitry connected to said input node to generate level identification signals indicating when said input signal is below a low guard band voltage, is above a high guard band voltage, and whether said input voltage is above a trip voltage between said low and high guard band voltages, said level identification signals comprising multiple bit digital signals; and level hold circuitry connected to said level identification circuitry to process said level identification signals to produce a single high digital output signal while said input signal falls below said low guard band voltage and then rises above said trip voltage, and to produce a low digital output signal only after said input signal rises above said high guard band voltage and then falls below said trip voltage.

13. A method of processing an input signal received from a bus of a computer, said input signal including spurious signal transitions before a peak value is reached, said method comprising the steps of:

identifying the instantaneous magnitude of said input signal to generate a level identification signal;

generating a level hold signal, in response to said level identification signal, during said spurious signal transitions and a level toggle signal after a first predetermined threshold is reached by said input signal; and maintaining a high digital output value in response to said level hold signal and said level identification signal during said spurious signal transitions and a low digital output value in response to said level toggle signal and said level identification signal after said peak value is reached.

14. The method of claim 13 wherein said identification signal of said identifying step includes a combination of digital high signals and digital low signals.

* * * * *